(12) United States Patent
Matano

(10) Patent No.: US 6,326,837 B1
(45) Date of Patent: Dec. 4, 2001

(54) DATA PROCESSING CIRCUIT HAVING A WAITING MODE

(75) Inventor: Tatsuya Matano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/604,529

(22) Filed: Jun. 27, 2000

(30) Foreign Application Priority Data

Jul. 1, 1999 (JP) .................................................. 11-187739

(51) Int. Cl.⁷ .............................................................. G05F 1/10
(52) U.S. Cl. ........................ 327/545; 327/530; 365/226; 307/44
(58) Field of Search ................................... 365/229, 228; 307/44, 46, 48; 327/530, 545

(56) References Cited

U.S. PATENT DOCUMENTS 5,731,735 * 3/1998 Yokota et al. ......................... 327/535
5,892,393 * 4/1999 Yamashita ............................. 327/545

FOREIGN PATENT DOCUMENTS 7-254685    10/1995 (JP) .

* cited by examiner

*Primary Examiner*—Jung Ho Kim
(74) *Attorney, Agent, or Firm*—Sughrue, Mion, Zinn, Macpeak & Seas, PLLC

(57) ABSTRACT

A DRAM includes a first power source section for supplying a higher operational voltage in an active mode and a lower waiting voltage in a waiting mode to a data processing section through a source line, a compensating capacitor connected to the source line for alleviating the fluctuations on the source line, a second power source section for supplying the operational voltage to the compensating capacitor, and a switch for coupling the source line to the compensating capacitor in the active mode.

4 Claims, 5 Drawing Sheets

DATA PROCESSING CIRCUIT HAVING A WAITING MODE

BACKGROUND OF THE INVENTION (a). Field of the Invention

The present invention relates to a data processing circuit having a waiting mode and, more particularly, to a data processing circuit operating in an active mode and a waiting mode based on the mode switching signal.

(b). Description of the Related Art

Some data processing circuits such as a DRAM are operated for data processing in an active mode and for maintaining the data stored therein in a waiting mode. A circuit configuration of a DRAM will be described below with reference to FIG. 1 as an example of such a data processing circuit.

The DRAM, generally denoted by numeral 100, includes a data processing section 101, a power source section 102 and a compensating capacitor 103 which are connected through a source line 104. The power source section 102 has a feed line 111, a pMOSFET 112 and a differential amplifier 113 for supplying a power source having an operational voltage of VINT through the source line 104.

More specifically, in the power source section 102, the feed line 111 is supplied with a power source having an external voltage of VEXT, whereas the inverting input of the differential amplifier 113 is applied with a reference voltage VREE The pMOSFET 112 has a source connected to the feed line 111 and a drain connected to the source line.

The gate of the pMOSFET 112 is connected to the output terminal of the differential amplifier 113, and the source line 104 is connected to the non-inverting input of the differential amplifier 113 for feed-back. In this configuration, the external voltage VEXT is converted by the power source section 102 into the operational voltage VINT, which is equal to the reference voltage VREF and fed through the source line 104.

The processing section 101 includes a memory cell array, a decoder block, a sense amplifier block etc., which are implemented by CMOSFETs and other transistors. The processing section 101 conducts for read/write operation of data in the memory cell array while consuming electric power having the operational voltage VINT.

The compensating capacitor 103 has a specified capacitance, and alleviates the fluctuations of the operational voltage VINT on the source line 104 due to the charge and discharge of the capacitor 103. These circuit components 101 to 104 are generally integrated into a single chip LSI, and may be called a single chip DRAM.

In the DRAM having such a configuration, the power source section 102 generates the operational voltage VINT, which allows the processing section 101 to operate for write/read processing. The compensating capacitor 103 alleviating the voltage fluctuations of the operational voltage VINT allows the data processing section 101 to operate in a stable state.

The DRAM 100 as described above is generally used as an electronic component in a computer system, for example. It is known that some of the DRAMs have modes including an active mode, an off mode and a waiting mode (sleep mode or inactive mode). The data processing section 101 operates for read/write processing to consume electric power if the DRAM 100 resides in the active mode, whereas the processing section 101 does not operate for read/write processing if the DRAM 100 resides in the off mode or the waiting mode.

If the operational voltage supplied to the data processing section 101 is made completely off, the data stored in the processing section 101 is lost. This mode is called an off mode wherein the supply of power source is completely stopped for allowing the stored data to be lost in the data processing section 101.

In a waiting mode, the data processing section 101 does not operate for read/write processing and maintains the data already stored therein, thereby dissipating only a small amount of electric power. The power source section 102 supplies the operational voltage to the processing circuit in this mode to allow the processing circuit to maintain the data.

Along with the increase in the integration density of the DRAM or LSI, the MOSFETs have lower threshold voltages which cause the increase of the leakage current. Thus, the power source dissipated by the data processing section in the waiting mode increases and is not negligible in the large integrated circuit.

Patent Publication JP-A-7-254685 describes a data processing circuit for lowering the power dissipation during the waiting mode, wherein the power source section generates a lower waiting voltage in the waiting mode, and the threshold voltage in the processing section is also raised by controlling the substrate voltage in the waiting mode.

In the described circuit, the lower waiting voltage supplied to the data processing section is raised up to the higher operational voltage during the transient period from the waiting mode to the operational mode. In this period, the increase of the line voltage on the source line by the power source section is mainly used for charging the compensating capacitor, which is maintained at the lower waiting voltage in the previous waiting mode. Thus, the higher operational voltage is not supplied to the processing section in a short time during the transient period, which fact delays the response of the processing section just after shifting of the mode from the waiting mode to the operational mode.

SUMMARY OF THE INVENTION

In view of the above, it is an object of the present invention to provide a data processing circuit for operating in an active mode and a waiting mode, which is capable of operating at a higher speed during a transient state shifting from the waiting mode to the active mode.

The present invention provides a data processing circuit including: a first power source section for generating an operational voltage in an active mode and a waiting voltage in a waiting mode, the waiting voltage is lower than the operational voltage; a data processing section connected to said first power source section through a source line for receiving the operational voltage in the active mode and the waiting voltage in the waiting mode; a second power source section for generating a preliminary voltage which is higher than the waiting voltage; a compensating capacitor connected to the second power source section at least in the waiting mode for receiving electric charge from the second power source section; and a switching section for coupling said source line and said compensating capacitor together in the active mode and decoupling said source line from said compensating capacitor in the waiting mode.

In accordance with the data processing circuit of the present invention, since the compensating capacitor is charged during the waiting mode, the first power source section need not charge the compensating capacitor up to the preliminary voltage just after shifting of the mode from the waiting mode to the active mode. Thus, the data processing circuit can respond to the shift of the mode at a high speed.

The above and other objects, features and advantages of the present invention will be more apparent from the following description, referring to the accompanying drawings.

PREFERRED EMBODIMENT OF THE INVENTION

Figure 1:
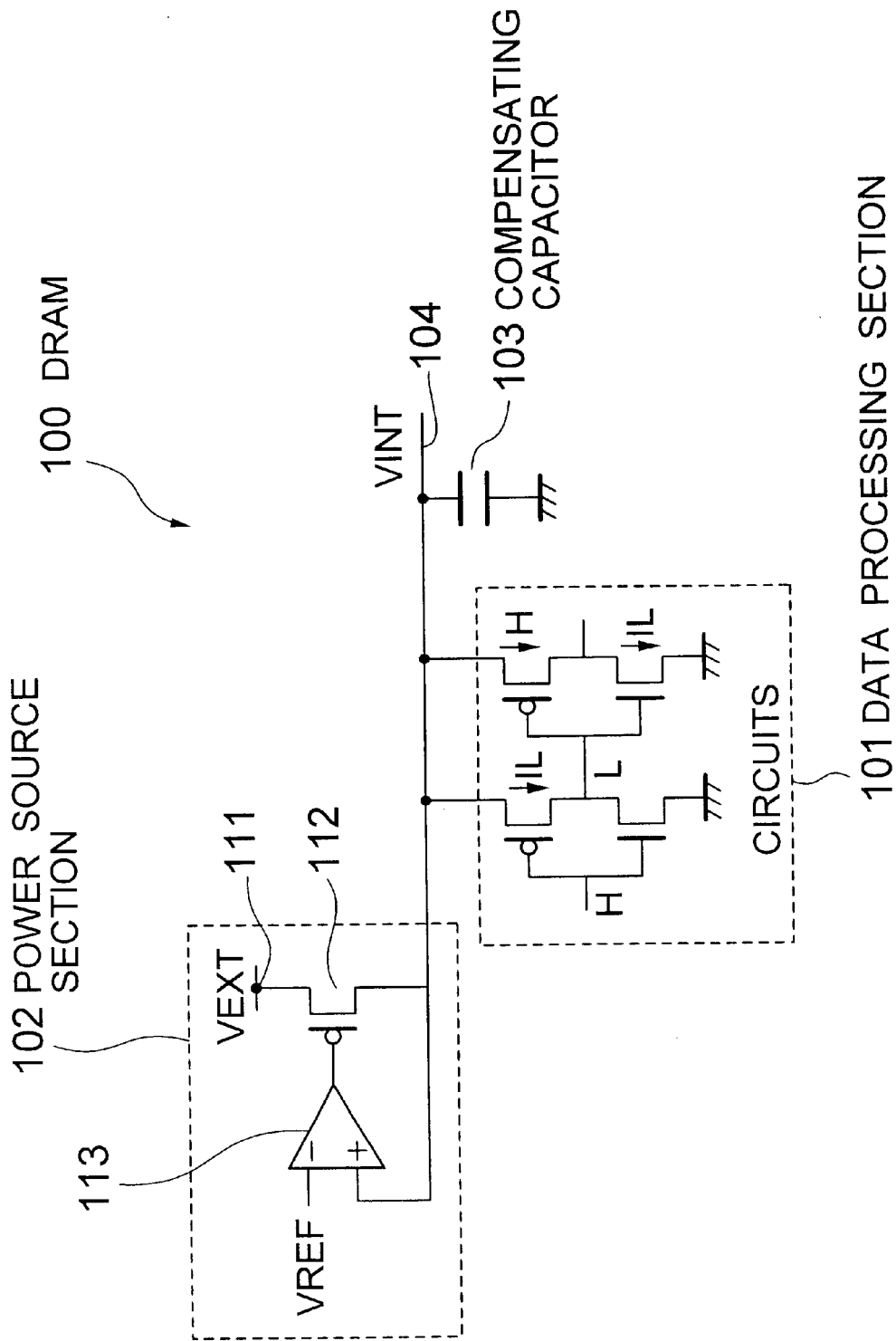
FIG. 1 is a block diagram of a conventional data processing circuit.

Now, the present invention is more specifically described with reference to accompanying drawings, wherein similar constituent elements are designated by similar reference numerals throughout the drawings.

Figure 2:
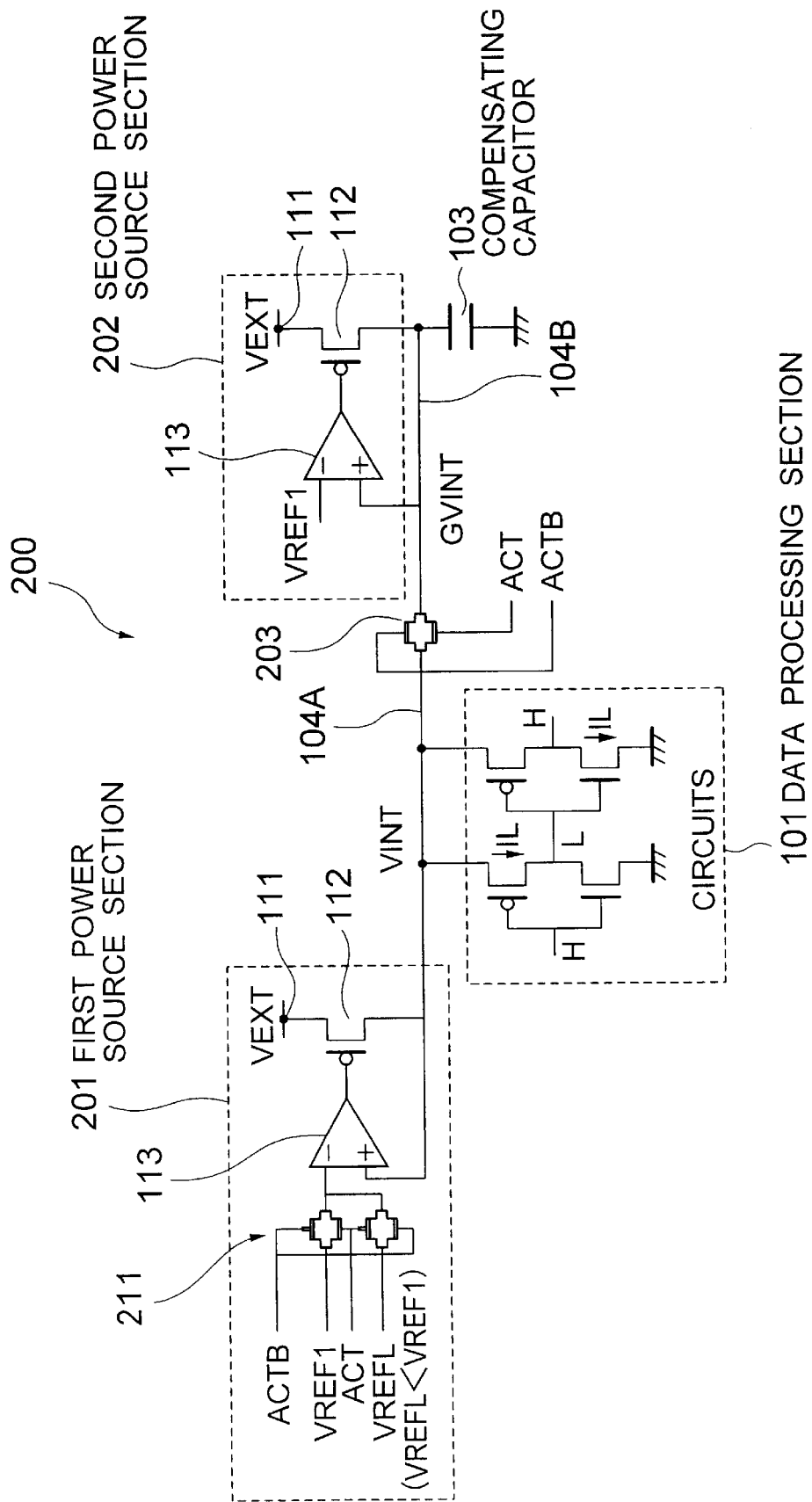
FIG. 2 is a block diagram of a data processing circuit according to an embodiment of the present invention implemented as a DRAM.

Referring to FIG. 2, a data processing circuit, generally designated by numeral 200, according to an embodiment of the present invention is implemented as a DRAM 200, which includes a data processing section 101, a compensating capacitor 103, and first and second power source sections 201 and 202 coupled together through a power source lines 104A and 104B, and a coupling switch 230 for coupling the source line 104A and the source line 104B together.

More specifically, the first power source section 201 is directly coupled to the data processing section 101 through the source line 104A, and the second power source section 202 is directly coupled to the compensating capacitor 103 through the source line 104B. The coupling switch 203 couples the source line 104A connected to the first power source section 201 and the data processing section 101 with the source line 104B connected to the second power source section 202 and the compensating capacitor 103 during an active mode of the data processing section, and decouples the source line 104A from the source line 104B during a waiting mode.

The first power source section 201 includes a feed line 111, a MOSFET 112 connected between the feed line 111 and the source line 104A, and a differential amplifier 113 having an inverting input for receiving a referential voltage through a voltage switching section 211 and a non-inverting input connected to the source line 104A.

The voltage switching section 211 receives complementary mode switching signals ACT and ACTB as control signals, and selects one of a first referential voltage VREF1 and a second referential voltage VREFL depending on the active levels or the inactive levels of the mode switching signals ACT and ACTB. By this configuration, the voltage switching section 211 selects the first referential voltage VREF1 (or a higher referential voltage) during the active mode of the DRAM 200, and selects the second referential voltage VREFL (or a lower referential voltage) during the inactive mode. Thus, the first power source section 201 generates a higher operational voltage VINT which is equal to VREF1 during the active mode, and generates a lower waiting voltage which is equal to VREFL during the waiting mode.

The second power source section 202 includes a feed line 111, a pMOSFET 112 connected between the feed line 111 and the source line 104B, and a differential amplifier 113 having an inverting input for receiving the first referential voltage VREF1 and a non-inverting input connected to the source line 104B. By this configuration, the second power source section 202 provides a preliminary voltage GVINT, which is equal to the operational voltage VINT, to the source line 104B and the compensating capacitor 103.

The coupling switch 203 couples and decouples the source line 104A and the source line 104B depending on the active level or the inactive level of the mode switching signals ACT and ACTB. Thus, the source line 104B and the compensating capacitor 103 are coupled to and decoupled from the source line 104A, the first power source line 201 and the data processing section 101 depending on the active mode or the waiting mode of the data processing circuit 200.

In the configuration of the data processing circuit 200 of FIG. 2, those constituent elements are integrated on a single substrate. Thus, even if the data processing section 101 has a significant leakage current by itself during the waiting mode, the lower waiting voltage on the source line 104A in the data processing circuit 200 reduces the power dissipation in the data processing section 101 caused by the leakage current.

Figure 3:
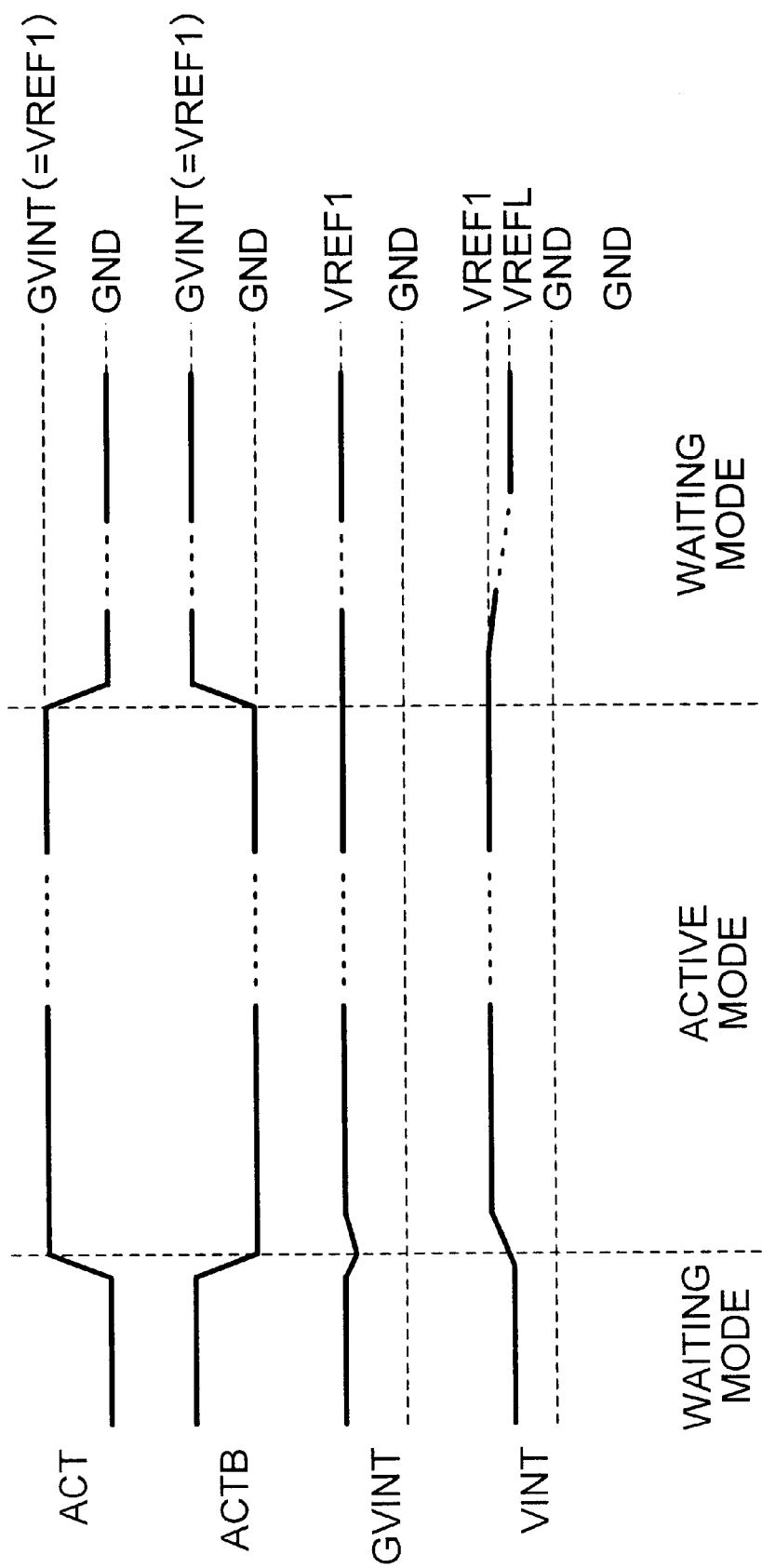
FIG. 3 is a timing chart of signals in the data processing circuit of FIG. 2.

Referring to FIG. 3, in the active mode of the data processing circuit 200 of the present embodiment, the mode switching signals ACT and ACTB are active high and active low, respectively. The coupling switch 203 couples the source lines 104A and 104B together based on the active low level of the mode switching signal ACTB, and the first and second power source sections 201 and 202 deliver the operational voltage VINT and the preliminary voltage GVINT, respectively, which are identical in the voltage level. The data processing section 101 operates for read/write processing based on the operational voltage VINT, the fluctuations of which are alleviated by the compensating capacitor 103.

In the waiting mode of the data processing circuit 200, the coupling switch 203 decouples the source line 104A from the source line 104B based on the inactive high level of the mode switching signal ACTB, and the first and second power source sections 201 and 202 generate the lower waiting voltage and the preliminary voltage GVINT, respectively, which is equal to the higher operational voltage VINT. The data processing section 101 maintains the data stored therein based on the lower waiting voltage without read/write processing.

The higher preliminary voltage GVINT generated by the second power source section 202 in the waiting mode is delivered to the compensating capacitor 103, which is charged to have a terminal voltage equal to the operational voltage VINT used in the waiting mode.

When the mode switching signals ACT and ACTB shift from the waiting mode to the active mode, the coupling switch 203 couples the source lines 104A and 104B together based on the active low level of the mode switching signal ACTB, and the first and second power source sections 201 and 202 generate the operational voltage VINT and the preliminary voltage GVINT which are identical in the voltage level. In this stage, it is sufficient that the electric charge necessary for raising the source line 104A from the lower waiting voltage to the higher operational voltage be supplied, because the compensating capacitor 103 has the higher preliminary voltage across the terminals thereof. This allows the source line 104A to recover the higher operational voltage at a higher speed, whereby the response of the data processing section 101 can be improved.

In addition, the decoupling of the source line 104A from the source line 104B in the waiting mode allows the first and second power source sections 201 and 202 generate respective voltages. Thus, both the operation by the data processing section 101 and the charge up of the compensating capacitor 103 can be conducted without an interference therebetween.

The equality of the operational voltage VINT and the preliminary voltage GVINT allows the second power source section 202 to assist the first power source section 201 to generate necessary power during the active mode of the data processing circuit 200. In other words, the first and second power source sections 201 and 202 act as a pair of power source sections during the active mode, and it is sufficient that the pair of power source sections have a source capacity needed for operating the data processing section 101.

The configurations of the first and second power source sections 201 and 202 can be modified from the above embodiment.

Figure 4:
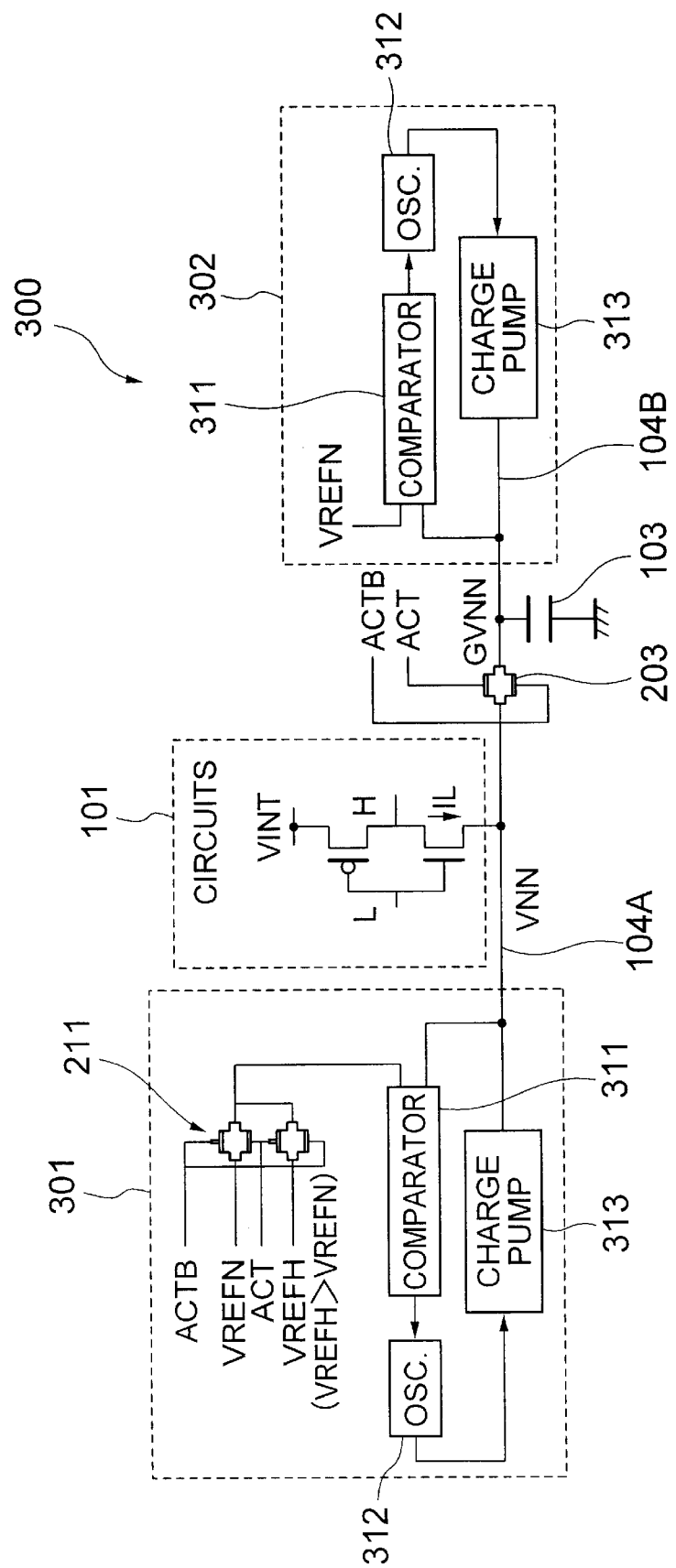
FIG. 4 is a block diagram of a modification of the data processing circuit of FIG. 2.

Referring to FIG. 4 showing a modification of the data processing circuit 200 of FIG. 2, each of the first and second power source sections 301 and 302 in the modified data processing circuit 300 includes a comparator 311 for comparing the voltage on the source line 104A or 104B against a reference voltage, an oscillator 312 for operating based on the result of the comparison by the comparator 311, and a charge pump 313 controlled by the output of the oscillator 312 to raise or lower the voltage on the source line 104A or 104B. The comparator 311 of the first source section 301 receives either a negative first referential voltage VREFN or a negative second referential voltage VREFH which has a lower absolute voltage, based on the active or inactive level of the mode switching signals. In this configuration, each of the power source sections 301 and 302 can generate a voltage having a negative polarity.

Figure 5:
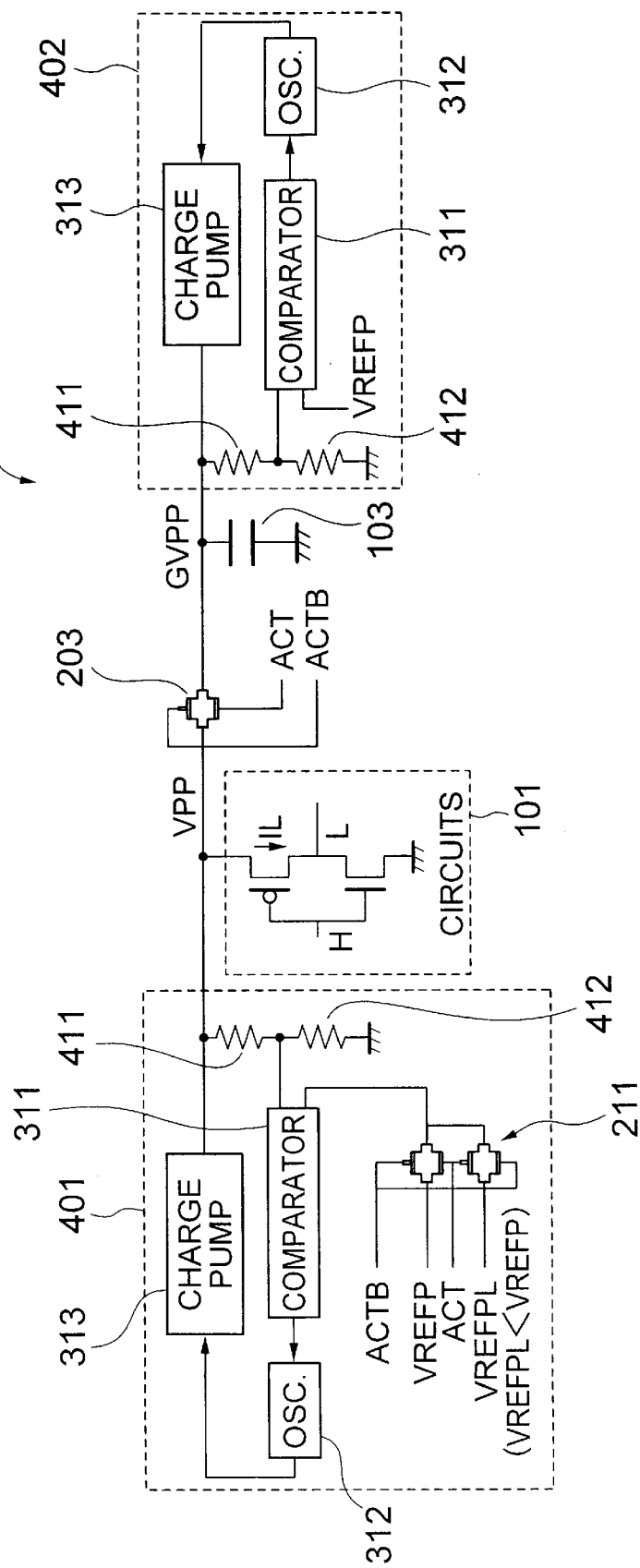
FIG. 5 is a block diagram of another modification of the data processing circuit of FIG. 2.

Referring to FIG. 5, another modification of each of the power source sections 401 and 402 in the data processing circuit 400 includes a resistive divider having serial resistors 411 and 412 which divide the voltage on the source line 104A or 104B. The reference voltage selector 211 selects either a higher positive reference voltage VREFP or a lower positive reference voltage VREFPL. In this configuration, the power source sections 401 and 402 can generate any desired voltages by using the resistive divider.

Since the above embodiments are described only for examples, the present invention is not limited to the above embodiments and various modifications or alterations can be easily made therefrom by those skilled in the art without departing from the scope of the present invention. For example, the second power source section 202 may be stopped and separated from the compensating capacitor 103 in the active mode.

What is claimed is:

1. A data processing circuit comprising:

a first power source section for generating an operational voltage in an active mode and a waiting voltage in a waiting mode, the waiting voltage is lower than the operational voltage;

a data processing section connected to said first power source section through a source line for receiving the operational voltage in the active mode and the waiting voltage in the waiting mode;

a second power source section for generating a preliminary voltage which is higher than the waiting voltage;

a compensating capacitor connected to the second power source section at least in the waiting mode for receiving electric charge from the second power source section; and a switching section for coupling said source line and said compensating capacitor together in the active mode and decoupling said source line from said compensating capacitor in the waiting mode.

2. The data processing circuit as defined in claim 1, wherein the preliminary voltage is substantially equal to the operational voltage.

3. The data processing circuit as defined in claim 1, wherein said compensating capacitor is connected to the second power source section in the active mode.

4. The data processing circuit as defined in claim 1, wherein said first power source section, data processing section, said second power source section, said compensating capacitor and said switching section are integrated on a single substrate.

* * * * *